US009239753B2

United States Patent
Maheshwari et al.

(10) Patent No.: US 9,239,753 B2
(45) Date of Patent: *Jan. 19, 2016

(54) DRAM ADDRESS PROTECTION (71) Applicant: Cavium, Inc., San Jose, CA (US)

(72) Inventors: Aseem Maheshwari, Fremont, CA (US); Michael S. Bertone, Marlborough, MA (US); Richard E. Kessler, Northborough, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/629,770

(22) Filed: Feb. 24, 2015

(65) Prior Publication Data

US 2015/0169399 A1 Jun. 18, 2015

Related U.S. Application Data (63) Continuation of application No. 13/325,943, filed on Dec. 14, 2011, now Pat. No. 8,977,944.

(60) Provisional application No. 61/423,067, filed on Dec. 14, 2010.

(51) Int. Cl.
| | | |
|---|---|---|
| *G11C 29/00* | (2006.01) | |
| *G06F 11/00* | (2006.01) | |
| *G06F 11/10* | (2006.01) | |
| *H03M 13/09* | (2006.01) | |

(52) U.S. Cl.
CPC ........ *G06F 11/1004* (2013.01); *G06F 11/1016* (2013.01); *G06F 11/1076* (2013.01); *H03M 13/09* (2013.01)

(58) Field of Classification Search
CPC . G06F 11/1012; G06F 11/1016; G06F 11/08; H03M 13/09
USPC ........... 714/805, 768, 753, 53, 758, 751, 752, 714/757, 763, 769–773, 799, 800, 6.24, 52
See application file for complete search history.

(56) References Cited

U.S. PATENT DOCUMENTS

| | | | | |
|---|---|---|---|---|
| 5,392,302 | A * | 2/1995 | Kemp et al. | 714/805 |
| 5,455,834 | A * | 10/1995 | Chang et al. | 714/768 |
| 6,751,769 | B2 * | 6/2004 | Chen et al. | 714/767 |
| 8,972,816 | B2 * | 3/2015 | Ozturk et al. | 714/758 |
| 8,977,944 | B2 | 3/2015 | Maheshwari et al. | |

OTHER PUBLICATIONS

Phelps, Andrew E., "Constructing an Error Correcting Code," University of Wisconsin, Madison, http://pages.cs.wisc.edu/~markhill/cs552/Fall2006/handouts/ConstructingECC.pdf, 7 pages(Nov. 9, 2006).

* cited by examiner

*Primary Examiner* — Christine Tu
(74) *Attorney, Agent, or Firm* — Hamilton, Brook, Smith & Reynolds, P.C.

(57) ABSTRACT

In one embodiment, a system includes a memory, and a memory controller coupled to the memory via an address bus, a data bus, and an error code bus. The memory stores data at an address and stores an error code at the address. The error code is generated based on a function of the corresponding data and address.

22 Claims, 8 Drawing Sheets

| CCCCCCC 7:0 | DATA SITE 63:0 | | | | | | | | | | | | | | | |
|---|---|---|---|---|---|---|---|---|---|---|---|---|---|---|---|---|
| | 63:60 | 59:59 | 55:52 | 51:48 | 47:44 | 43:40 | 39:36 | 35:32 | 31:28 | 27:24 | 23:20 | 19:16 | 15:12 | 11:8 | 7:4 | 3:0 |
| 00000001 | 1011 | 0100 | 1101 | 0001 | 1011 | 0100 | 1101 | 0001 | 0100 | 1011 | 0010 | 1110 | 0100 | 1011 | 0010 | 1110 | 0xB4D1B4D144BE4B2E
| 00000010 | 0001 | 0101 | 0101 | 0111 | 0001 | 0101 | 0101 | 0111 | 0001 | 0101 | 0101 | 0111 | 0001 | 0101 | 0101 | 0111 | 0x1557155715571557
| 00000100 | 1010 | 0110 | 1001 | 1001 | 1010 | 0110 | 1001 | 1001 | 1010 | 0110 | 1001 | 1001 | 1010 | 0110 | 1001 | 1001 | 0xA699A699AA69A699
| 00001000 | 0011 | 1000 | 1110 | 0011 | 0011 | 1000 | 1110 | 0011 | 0011 | 1000 | 1110 | 0011 | 0011 | 1000 | 1110 | 0011 | 0x38E338E3338E338E3
| 00010000 | 1100 | 0000 | 0000 | 1100 | 1100 | 0000 | 1111 | 1100 | 1100 | 0000 | 1111 | 1100 | 1100 | 0000 | 1111 | 1100 | 0xC0FCC0FCC0CC0FC
| 00100000 | 1111 | 1111 | 0000 | 0000 | 1111 | 1111 | 0000 | 0000 | 1111 | 1111 | 0000 | 0000 | 1111 | 0000 | 1111 | 0000 | 0xFF00FF00FFFOFF00
| 01000000 | 1111 | 1111 | 1111 | 0000 | 1111 | 1111 | 0000 | 1111 | 1111 | 1111 | 0000 | 0000 | 0000 | 0000 | 1111 | 0000 | 0xFF0000FFFFFF000FF
| 10000000 | 0000 | 0000 | 1111 | 1111 | 1111 | 1111 | 0000 | 0000 | 1111 | 1111 | 0000 | 0000 | 1111 | 0000 | 1111 | 1111 | 0x00FFFF00FFFF000FF
| xxxxxxxx | 0000 | 0000 | 0000 | 0000 | 0000 | 0000 | 0000 | 0000 | 0000 | 0000 | 0000 | 0000 | 0000 | 0000 | 0000 | 0000 |
| xxxxxxxx | xxxx | xxxx | xxxx | xxxx | xxxx | xxxx | xxxx | xxxx | xxxx | xxxx | xxxx | xxxx | xxxx | xxxx | xxxx | xxxx |
| 84210000 | 7766 | 6666 | 9999 | 9988 | BBAA | AAAA | 5555 | 5544 | FFEE | EEEE | 1111 | 1100 | 3322 | 2222 | DDDD | DDCC |
| 00008421 | 50DB | 8742 | DB87 | 42AF | 50DB | 8742 | DB87 | 42AF | 41CA | 9653 | CA96 | 53BE | 41CA | 9653 | CA96 | 53BE | ←SYNDROMES

Figure 4A

|  408 | 410 | 412 |  |  |  |  |  | 414 |
|---|---|---|---|---|---|---|---|---|
| GrayCode BURST 3:0 | | ADDRESS 34:7 | | | | | | |
| 1101 | 0xD | 0010 | 1010 | 1010 | 1110 | 0101 | 0101 | 0101 | 0x2AAE555 |
| 1101 | 0xD | 1101 | 1101 | 0001 | 0110 | 1011 | 1010 | 0010 | 0xDD16BA2 |
| 1110 | 0xC | 1001 | 0101 | 0101 | 1011 | 0010 | 1010 | 1011 | 0x955B2AB |
| 0110 | 0x6 | 1110 | 0101 | 0110 | 0011 | 1100 | 1010 | 1100 | 0xE563CAC |
| 0110 | 0x6 | 1111 | 1001 | 1000 | 0011 | 1111 | 0011 | 000 | 0xF983F30 |
| 0110 | 0x6 | 1111 | 1110 | 0000 | 0011 | 1111 | 1100 | 0000 | 0xFE03FC0 |
| 0001 | 0x1 | 0000 | 0000 | 0000 | 0011 | 1111 | 1111 | 1111 | 0x0003FFF |
| 0110 | 0x6 | 1111 | 1111 | 1111 | 1100 | 0000 | 0000 | 0000 | 0x7FFC000 |
| | | | | | | | | | |
| 0000 | | 0000 | 0000 | 0000 | 0000 | 0000 | 0000 | 0000 | |
| xxxx | | xxxx | xxxx | xxxx | xxxx | xxxx | xxxx | xxxx | |
| 0BB4 | | 3BBB | BAA9 | 9888 | 8877 | 7777 | 6655 | 4444 | ←SYNDROMES |
| 7FC3 | | EA96 | 3E1E | 1C96 | 53FC | A963 | E1E1 | C965 | |

| 422 | 424 | 422 | 424 |
|---|---|---|---|
| Address<6:3> | GrayCode<3:0> | Address<6:3> | GrayCode<3:0> |
| 0x0 | 0x0 | 0x8 | 0xC |
| 0x1 | 0x1 | 0x9 | 0xD |
| 0x2 | 0x3 | 0xA | 0xF |
| 0x3 | 0x2 | 0xB | 0xE |
| 0x4 | 0x6 | 0xC | 0xA |
| 0x5 | 0x7 | 0xD | 0xB |
| 0x6 | 0x5 | 0xE | 0x9 |
| 0x7 | 0x4 | 0xF | 0x8 |

DRAM ADDRESS PROTECTION

RELATED APPLICATIONS

This application is a continuation of U.S. application Ser. No. 13/325,943, filed Dec. 14, 2011, now U.S. Pat. No. 8,977,944, claims the benefit of U.S. Provisional Application No. 61/423,067, filed on Dec. 14, 2010. The entire teachings of the above application are incorporated herein by reference.

BACKGROUND

DDR3 SDRAM is a dynamic random access memory (DRAM) standard provides a high-bandwidth interface. Typical DDR3 DIMMs provides mechanisms for address and command protection by the use of two pins: a parity-in pin ("PAR_IN") and an error out pin ("ERR_OUT#"). These two pins indicate parity associated with an accompanying address or command. A memory controller can determine the integrity of a transmitted message based on the data transmitted on the two pins.

SUMMARY

In one embodiment, a system includes a memory, and a memory controller coupled to the memory via an address bus, a data bus, and an error code bus. The memory stores data at an address and stores an error code at the address. The error code is generated based on a function of the corresponding data and address.

The memory may be an external memory or a double data rate memory. The memory and memory controller may be not coupled via an address parity line or an address parity error line, such that protecting integrity of bits on the address bus may be performed by the error codes transmitted via the error code bus. The memory may include a register, wherein the register may be configured to receive address information and relay the address information to a corresponding portion of the memory. The register may include at least one of an address parity line and an address parity error line. The address parity line and the address parity error line may be unused.

The error code may indicate detection of single errors of the address. The error code may indicate corrections of single errors and detection of double errors of the data. The error code may protect both the address and the data between the memory and the memory controller. The error code may be 8 bits. The error code may be generated by an exclusive-or operation of selected bits of the data and selected bits of the address.

In one embodiment, a user may select a mode of error code protection of the data among at least one of protecting the data, protecting the address, and protecting both the data and the address.

In one embodiment, a method includes storing data in a memory at an address, where the memory is coupled to a memory controller via an address bus, a data bus, and an error code bus. The method further includes generating an error code based on a function of the data and the address and storing the error code at the address.

In one embodiment, a system includes a memory controller including a data interface, address interface, and an error interface, and an error code generator module configured to generate an error code based on an address transmitted over the address interface and data transmitted over the data interface corresponding to the address, both the data and the error code stored at the address, the error code transmitted over the error interface. The memory controller may be operatively coupled to a memory to store, at the address in the memory, the data and the error code.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1A:
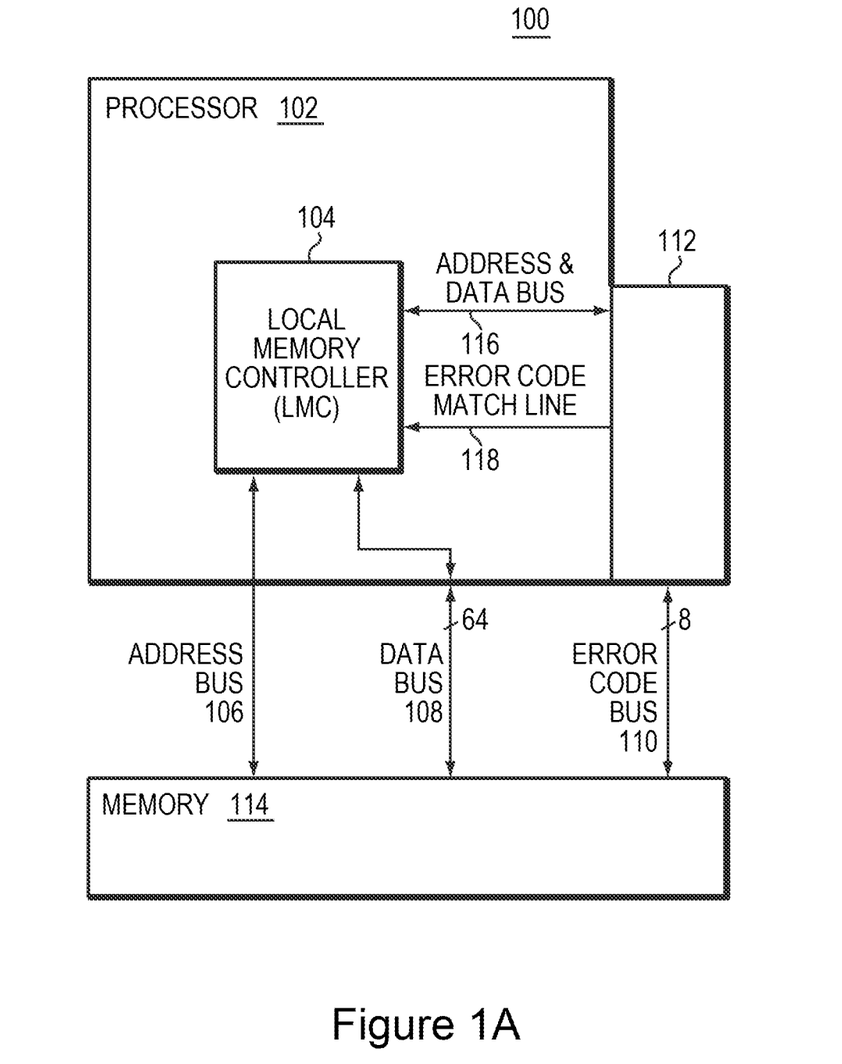
FIG. 1A is a block diagram of a system employed to protect data bits and address bits transmitted to a memory.

FIG. 1A is a block diagram 100 of a system employed to protect data bits and address bits transmitted to a memory 114. A processor 102 includes a local-memory controller (LMC) 104, which is also referred to as a memory controller. The LMC 104 is coupled to the memory 114 through an address bus 106 and a data bus 108. The memory 114 can include a DRAM such as a DDR3 DRAM.

When the LMC 104 writes to the memory 114, the LMC 104 transmits a destination address over the address bus 106 and data over the data bus 108. The memory 114 stores the data transmitted over the data bus 108 at the destination address transmitted over the address bus 106. When the LMC 104 reads from the memory 114, the LMC transmits a requested address over the address bus 106. The memory 114 retrieves data from the requested address and returns the data over the data bus 108 to the LMC 104.

A person of ordinary skill in the art can appreciate that the memory 114 or LMC 104 can transmit and receive errors while reading and writing if one or more of the bits of an address on the address bus 106 or the data bus 108 becomes corrupted. An error code, such as an error correcting code or ECC code, detects and corrects errors in bits transmitted to the memory 114. Typically, an error code only protects data transmitted over the data bus 108, and the error code does not protect address data transmitted over the address bus 106.

The LMC 104 is coupled to transmit addresses and data to an error code module 112 via an address and data bus 116 and to receive error code matching information from the error code module 112 via an error code match line 118. When the LMC 104 writes to the memory 114, the error code module 112 receives a destination address and data over the address and data bus 116 while the LMC 104 transmits or prepares to transmit the destination address over the address bus 106 and the data over the data bus 108. The error code module 112 generates an error code based on both the bits of the destination address and the data. The error code module 112 transmits the generated error code to the memory 114 over an error code bus 110. The memory 114 stores the error code at the destination address with the corresponding data.

When the LMC 104 reads from the memory 114, the LMC issues a requested address over the address bus 106 to the memory 114. The memory returns data over the data bus 108 to the LMC 104 and returns an error code over the error code bus 110 to the error code module 112. Then, LMC 104 also transmits the requested address and returned data to the error code module 112 via the address and data bus 116. The error code module 112 then generates an error code based on the requested address and returned data. The error code module 112 compares the generated error code with the received error code. If the two error codes match, then the error code module 112 notifies the LMC 104 that the data and address are not corrupted via the error code match line 118. If the error code does not match, then the error code module either i) fixes the error and returns the corrected data to the LMC via the address and data bus 116, in the case of a single error correction, or ii) notifies the LMC 104 that the bits have an error, in the case of a single error detect or double error detect. It is important to note that if the error code indicates a single error on the address, the error is uncorrectable because the data is retrieved from the erroneous address.

Figure 1B:
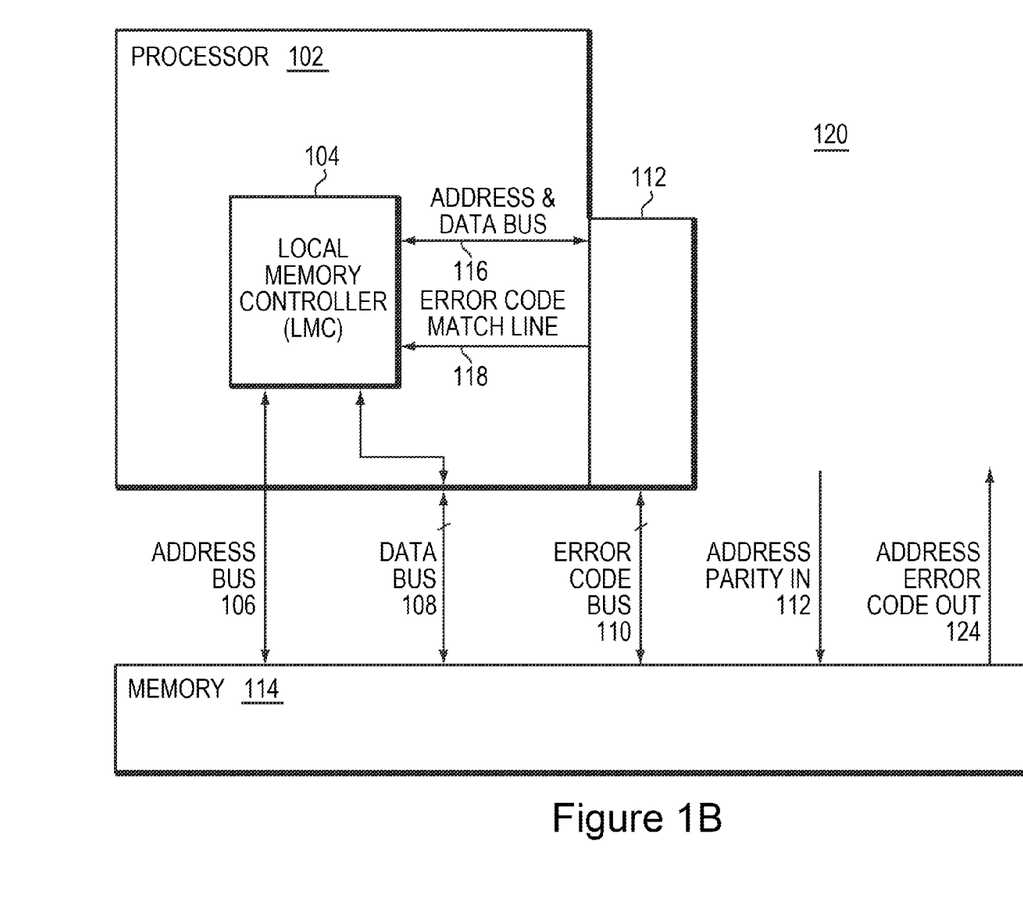
FIG. 1B is a block diagram of a system employed to protect data bits and address bits transmitted to a memory with additional inputs.

FIG. 1B is a block diagram 100 of a system employed to protect data bits and address bits transmitted to the memory 114 with additional inputs. The memory 114 includes an address parity in line 122 and an address error code out line 124, or ERR_OUT#. The memory 114 is configured to receive a parity code from a memory controller or semiconductor chip via the address parity in line 122. The memory is further configured to output an error code to a memory controller along an address error code out line 124. The processor 102 and LMC 104 require additional pins to be compatible with this address parity scheme. Therefore, as shown by FIG. 1B, the address parity in line 122 and address error code out line 124 are unconnected to either the processor 102 or LMC 104. The error code module 112, as described in reference to FIG. 1A, generates an error code that checks both the address and the data without the need for additional pins to connect the address parity in line 122 and address error code out line 124. A person of ordinary skill in the art can recognize that the LMC 104 and error code module 112 protects both data and address bits when coupled to a memory 114 that includes the address parity in line 122 and address error code out line 124 by leaving them unconnected, or when coupled to a memory 114 without an address parity in line 122 and address error code out line 124.

Figure 1C:
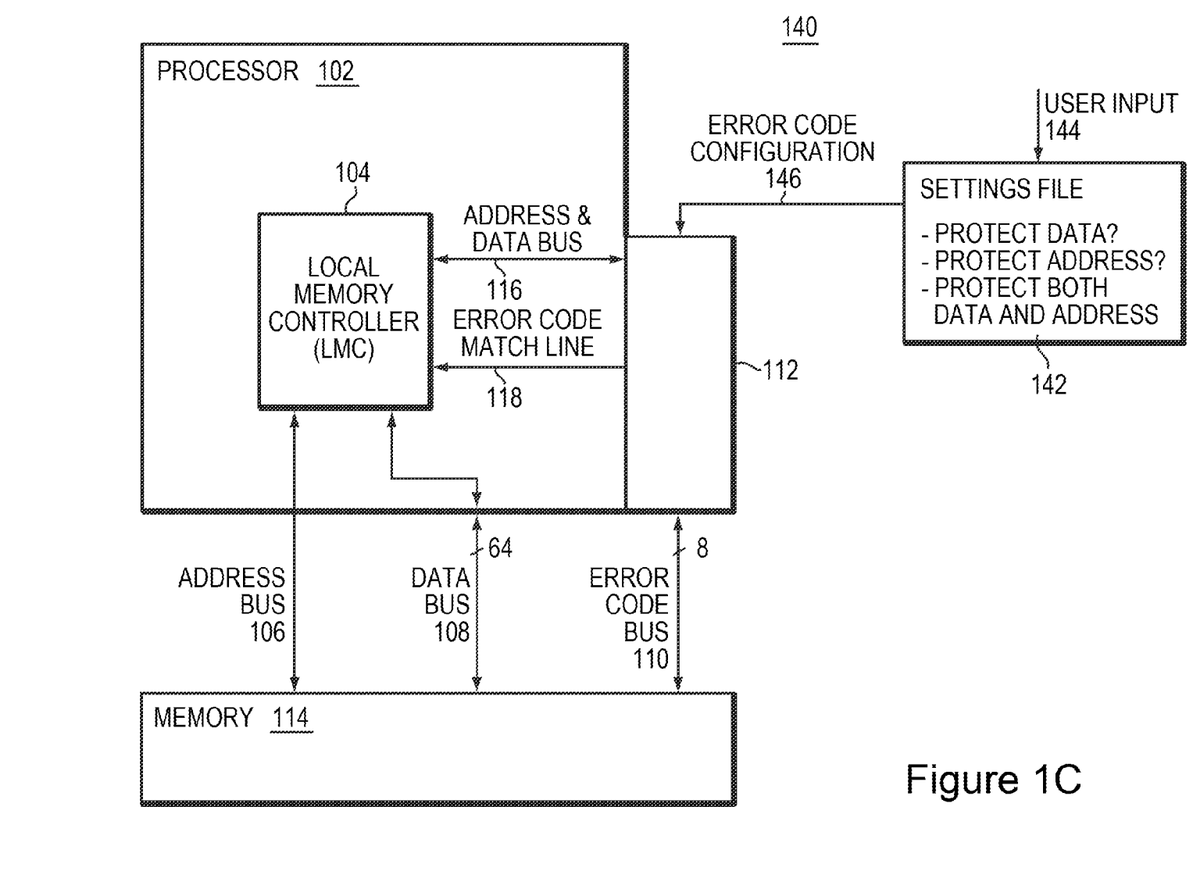
FIG. 1C is a block diagram of a system employed to protect data bits and address bits transmitted to a memory that is user configurable.

FIG. 1C is a block diagram 100 of a system employed to protect data bits and address bits transmitted to the memory 114 that is user configurable. The system illustrated in FIG. 1C is similar to the system illustrated in FIG. 1A, however the difference between the two embodiments is highlighted below. In reference to FIG. 1C, the error code module 112 is coupled to receive an error code configuration 146 from a settings file 142. The settings file 142 includes settings for various modes of the error code module. For instance, the settings file 142 can be set to i) only protect bits of data; ii) only protect bits of addresses; iii) protect both bits of data and bits of addresses; iv) provide no protection, i.e. protect neither bits of data nor bits of addresses. The settings file is set by user input 144. A person of ordinary skill in the art can recognize that the settings file 142 can include other settings or modes for the error code module 112.

Figure 2:
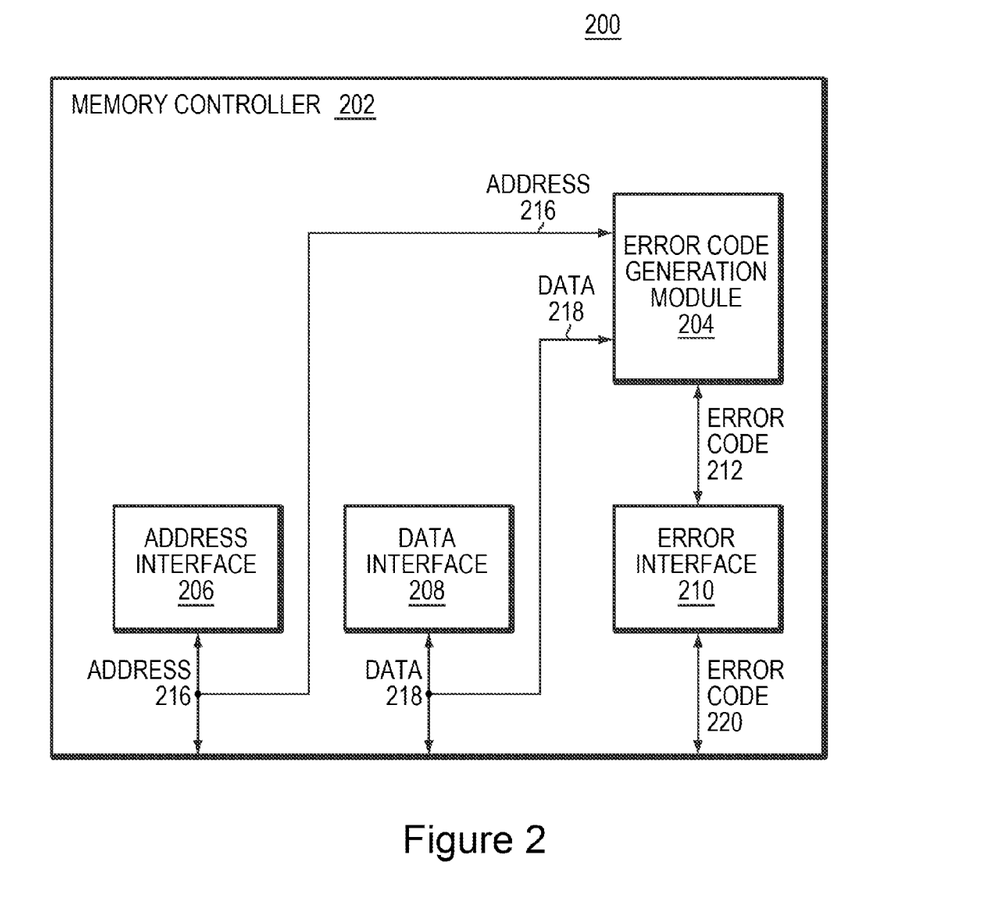
FIG. 2 is a block diagram of a memory controller employed to check for errors in an address and data bits configured to be coupled with a memory.

FIG. 2 is a block diagram 200 of a memory controller 202 employed to check for errors in an address and data bits configured to be coupled with a memory. An address interface 206 transmits and receives an address 216 and a data interface 208 transmits and receives data 218. A person of ordinary skill in the art can recognize that the memory controller 202 may receive read and write requests from components on a semiconductor chip, and relay those requests to the address interface 206 and data interface 208. Likewise, the responses from the address interface 206 and data interface 208 may be forwarded to components on a semiconductor chip.

The memory controller further includes an error code interface 210 coupled with an error code generation module 204. The error code generation module 204 is coupled to receive the address 216 from the address interface 206 and the data 218 from the data interface 208. When the memory controller is requesting to write to a memory, the error code module generates an error code 212 based on both the data 218 and the address 216. The error code 212 is transmitted to the error interface 210. The error interface then transmits the error code 220 to a memory to be stored with the data 218 at the address 216.

When the memory controller is requesting to read from memory, the address interface 206 requests to read from the memory by issuing an address 216 to the memory. The memory responds by returning data 218 to the data interface 208 and an error code 212 to the error interface 210. Both the address 216 and data 218 are also transmitted to the error code generation module 204, and the error interface 210 transmits the error code 212 to the error code generation module 204. The error code generation module 204 generates an error code based on the address 216 and received data 218. Then, the error code generation module 204 compares the generated error code to the error code 212 retrieved from memory. If the generated error code matches the error code 212, then the error code generation module 204 instructs the memory controller that the address 216 and data 218 are not corrupted. If the generated error code does not match the error code 212, then the error code generation module 204 instructs the memory controller that the address 216 and/or data 218 are corrupted. In one embodiment, the error code module can detect a single bit error. In another embodiment, the error code module can detect a double bit error in the data and address, detect a single bit error in the address, and correct a single bit error in the data.

Figure 3A:
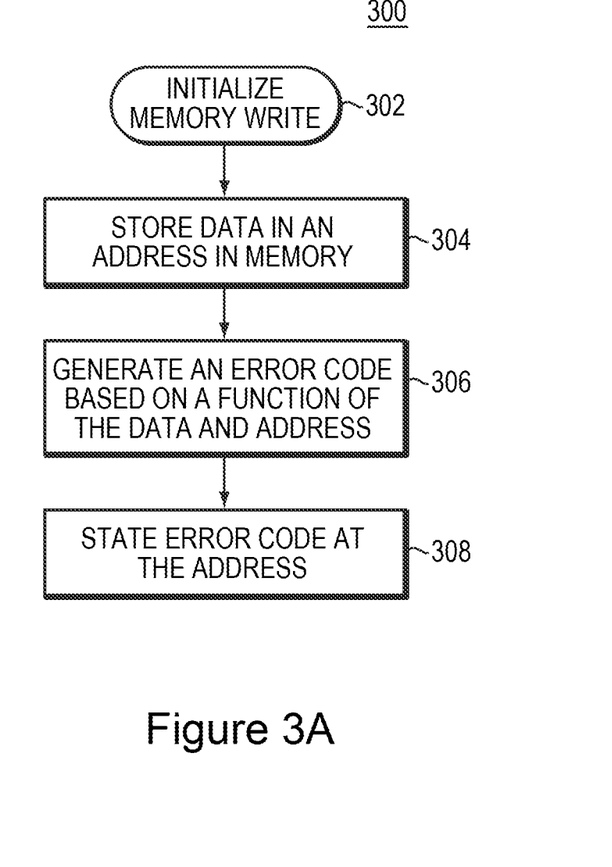
FIG. 3A is a flow diagram illustrating a method of generating an error code.

FIG. 3A is a flow diagram 300 illustrating a method of generating an error code. First, the system initializes a memory write (302). The system stores data in an address at the memory (304). At the same time the system generates an error code that is based on a function of both the data and the address (306). Then, the system stores both the error code and the data at the address (308).

Figure 3B:
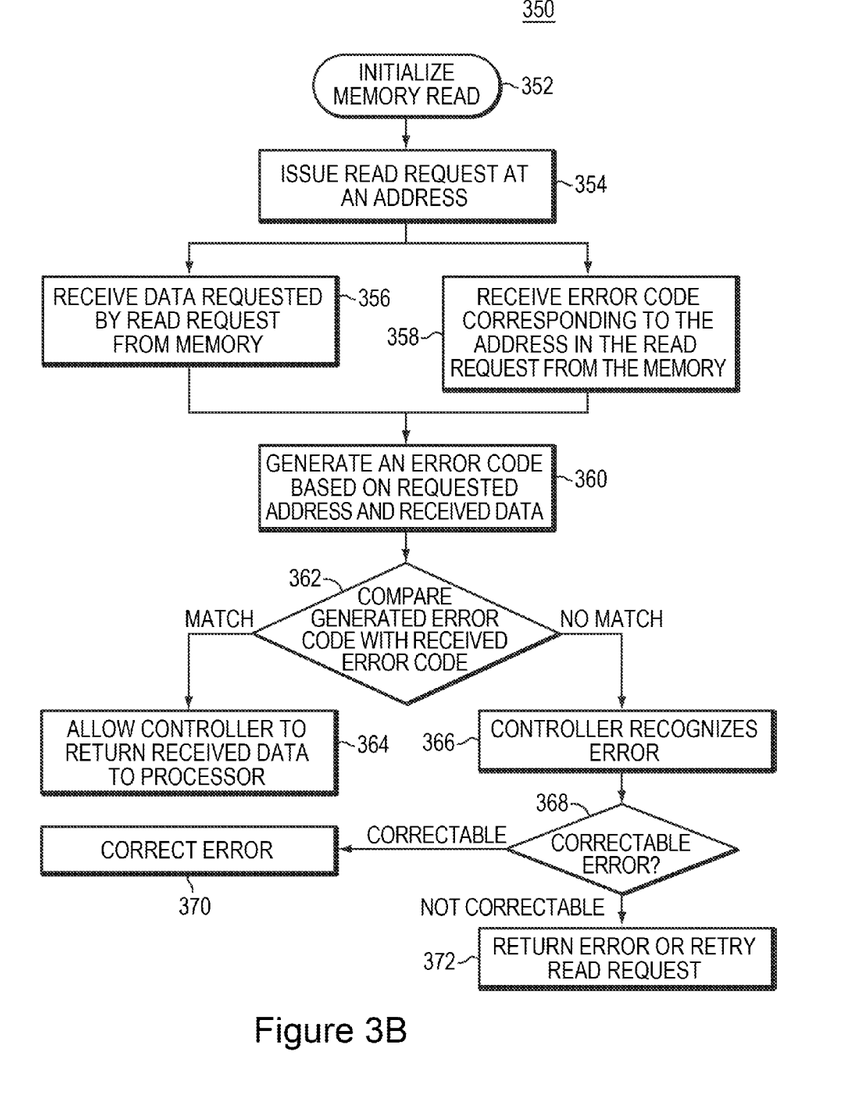
FIG. 3B is a flow diagram illustrating a method of receiving and comparing an error code.

FIG. 3B is a flow diagram 350 illustrating a method of receiving and comparing an error code. The system first initializes a memory read (352). The system then issues a read request at an address (354). In parallel, the system receives data requested by the read request from memory (356) and receives an error code corresponding to the address in the read request from the memory (358). The error code is stored with the data in the memory at the same address. The system then generates an error code based on the requested address and the received data (360). The system compares the generated error code with the received error code (362). When there is a match, the memory controller returns the received data to the processor (364). When there is no match, the controller recognizes that there is an error (366). The controller determines whether the error is correctable (368). An error is correctable if it is a single bit error in the data. When the error is a single bit error in the data, the controller corrects the error (370). An error is uncorrectable if it is a single bit error in the address or a double bit error in the data or address. When the error is not correctable the controller either returns that there was an error to the processor or retries the read request (372).

Figure 4A:
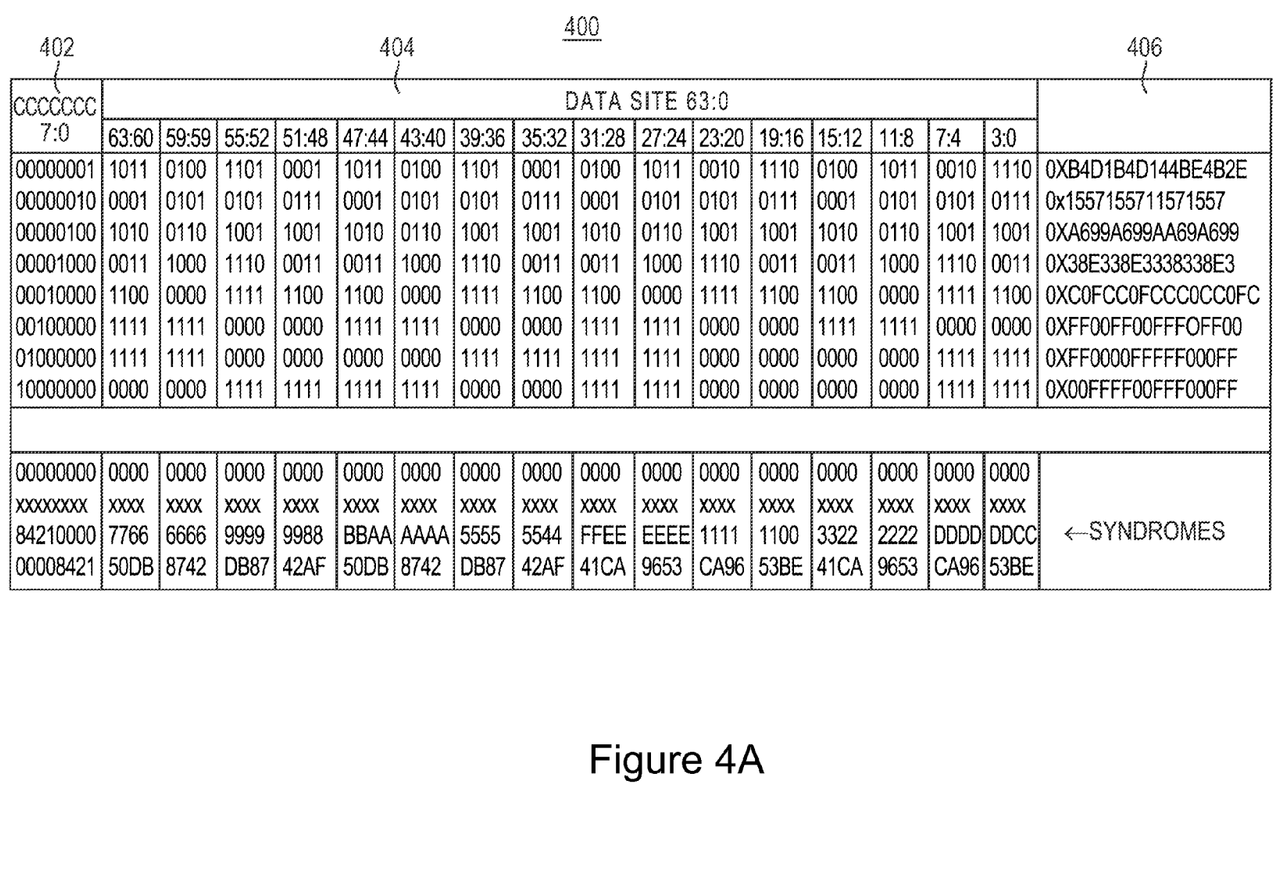
FIG. 4A is a table of an embodiment of parity check matrix.

FIG. 4A is a table of an embodiment of parity check matrix 400. The error code module 112 generates the error code, or check bit code, using 64-bits of data 404 and a 32-bit address 422 and 426 based on the parity check matrix 400, which is 104 columns by eight rows. The check bit code is Single Error Correct Double Error Detect ("SECDED"). The 32-bit address is divided into an upper 28-bits of the address and a gray code of the lower 4-bits. Additionally, the parity-check matrix 400 is constructed such that all check bit codes (e.g., columns) are unique, all check bit codes have odd parity, and the exclusive-or of any two check bit codes is not equal to any other check bit code.

The eight rows of the parity check matrix each represent a parity check bit 402. For instance, the first row represents a first pattern of bits to select from data and the address to exclusive-or to form a first check bit, the second row represents a second pattern of bits to select from data and the address to exclusive-or to form a second check bit, etc. Eight total parity check bits 402 are created in this manner for each data and address pair, each parity check bit 402 corresponding with a row.

Each row in the table represents a pattern of bits of the data and address to be exclusive-ORed together. For example, the 64-data bits 404 correspond to eight 64-bit patterns 406. Further, the upper 28 bits of the 32-bit address 412 correspond to eight 28-bit patterns 414 and the 4-bit gray code burst corresponds with eight 4-bit patterns.

The parity check matrix 400 has eight rows because checking the 96-bits of the address and the data requires 8-bits. While a single error detect code only requires a single bit to check any amount of bits, a SECDED code requires additional parity bits to correct single errors and detect double errors. The SECDED code requires eight parity bits, and therefore eight rows in the parity check matrix 400.

The error code module 112 selects bits of the data, the address, and the gray code transform by selecting bits of the pattern 406, 410, and 414 of each of the eight rows to create eight intermediary 96-bit patterns. In one embodiment, the error code module performs a bitwise AND operation on the pattern with the corresponding bits of data. Then, the error code module 112 exclusive-ORs the bits of the eight intermediary 96-bits patterns to create one bit corresponding to each pattern. Combined, the error code module 112 generates an 8-bit first check bit code for the data, address, and gray code transform. Alternatively, the error code module 112 can exclusive-OR the selected bits of the data and address directly with each other without creating the eight 96-bit intermediary patterns. Upon writing to the memory, this first check bit code is stored with the data in the memory.

When the error code module reads data from the memory, it reads the check bit code as well. The error code module 112 then performs the same process as described above on the requested read address and the received data to generate a second check bit code. Then, the error code module 112 exclusive-ORs the first check bit code with the second check bit code to create a syndrome. When the syndrome is zero, the error code module 112 assumes there is no error. When the syndrome has an odd parity, the error code module assumes there is a single-bit error within the data or address. The value of the syndrome indicates the single bit that has the error. If the syndrome is one for a data bit, the error code module 112 flips that single data bit to correct the error. If the syndrome is one for an address bit, however, the error code module 112 cannot directly correct the error, and may consider the error to be uncorrectable. In this scenario, where the address has a single bit error, the error code module 112 treats the uncorrectable address error like a two-bit data error.

When the syndrome has even parity, the error code module 112 assumes the data or address has two errors. The error code module 112 cannot fix this error under a SECDED code. For these errors, as well as any other errors considered "uncorrectable," the error code module 112 notifies the LMC 104 that there is an error. The LMC 104 can then re-request the read, if desired.

In another embodiment, the error code module 112 compares the syndrome to all known syndromes that are known to indicate a one-bit error. As in before, a syndrome equaling zero indicates that there is no error. The error code module 112 can compare the syndrome to all known syndromes using a memory, a logic-look up table, or other logic configuration. If the error code module 112 finds a known single-bit error syndrome in the data, it determines that there is a single-bit error in the data, locates the single-bit error in the data based on the syndrome, and then flips the single-bit to correct the error. If the error code module 112 finds an unknown one-bit error syndrome in either the data or the address, it assumes the error is uncorrectable. A single-bit error in the address is uncorrectable because the memory controller would fetch data from an address that contains an error, i.e., from the wrong address. The memory controller can issue a new read request with the correct address to fetch the correct data.

In DDR3 RDIMMs, incorrect parity commands may cause the command to be ignored. RDIMMs include a registered buffer in front of the memory module. In one embodiment, the memory, such as an RDIMM, includes a registered buffer pin may be tied to a static value, either low or high, while a write enable input can be flipped to guarantee either even or odd parity. In addition, the LMC 104 may modify a row address strobe input, column address strobe input, and the write enable input to the memory for bus transactions to guarantee correct parity. When incorrect parity causes a command to be ignored, the row address strobe input, column address strobe input, and write enable input are not used. Therefore, for commands that may be dropped due to incorrect parity, the values of these pins can bypass the register in the memory.

Figure 4B:
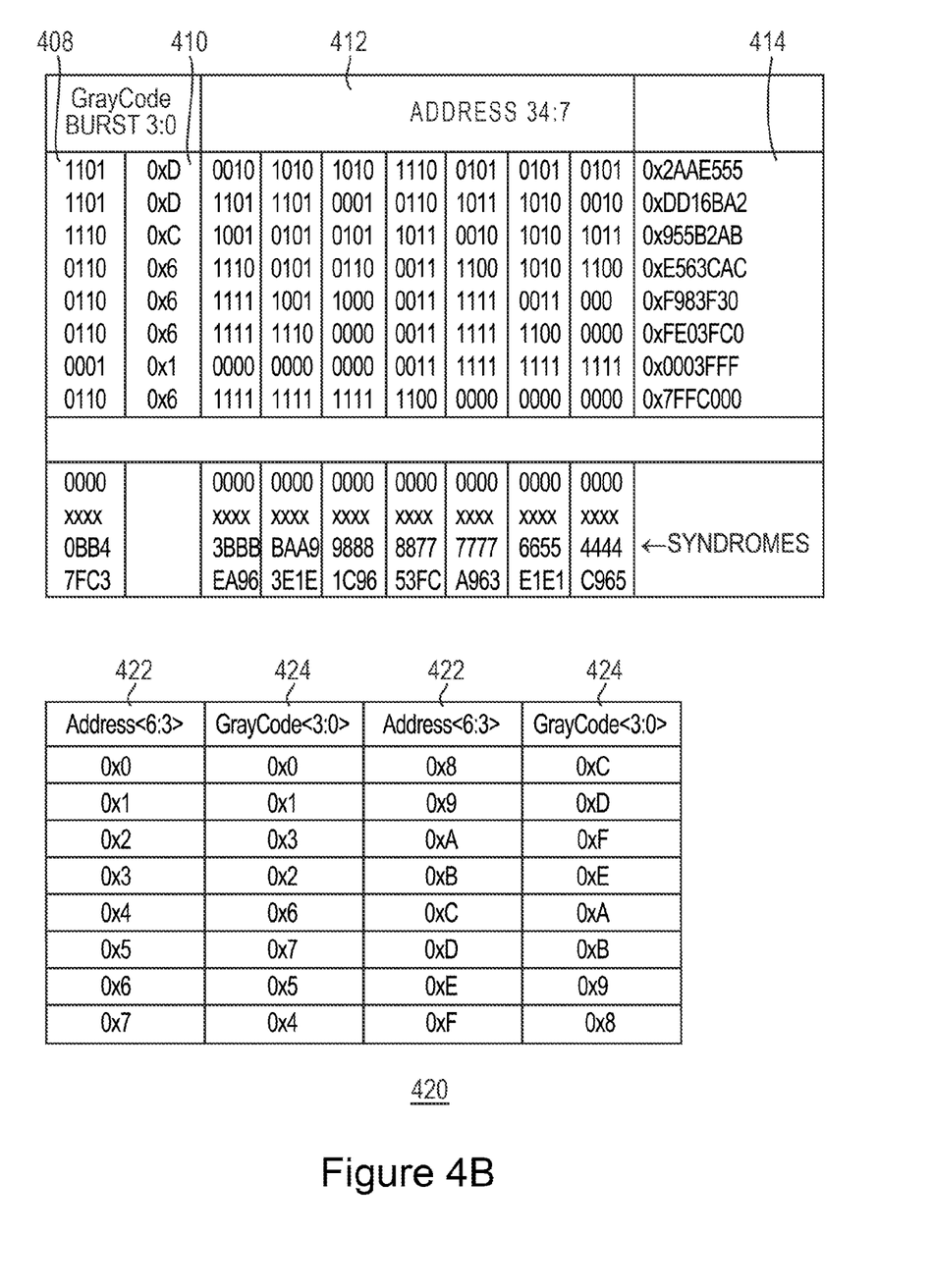
FIG. 4B is a table of an embodiment of a gray code transform.

FIG. 4B is a table 420 of an embodiment of a gray code transform. The transform converts the lower 4-bits 422 of the 32-bit address to a gray code 424. Providing a gray code transform for the lower 4-bits of the 32-bit address enables the memory controller 104 to sequentially access memory, in addition to performing interleaved accesses. A person of ordinary skill in the art can recognize that the number of bits in the lower and upper addresses, and data can be adjusted.

While this invention has been particularly shown and described with references to example embodiments thereof, it will be understood by those skilled in the art that various changes in form and details may be made therein without departing from the scope of the invention encompassed by the appended claims.

What is claimed is:

1. A memory controller comprising:
   a data interface coupled to a memory via a data bus, the data interface configured to write data to an address in the memory;

an address interface coupled to the memory via an address bus, the address interface to provide the address to the memory;

an error code generation module configured to generate an error code based on a function of the data and the address, the error code being a combination of a check bit code and a gray code; and an error interface configured to, responsive to a write request for the data, store the error code at a portion of the memory corresponding to the address.

2. The memory controller of claim 1, wherein the data interface is further configured to enable performing both sequential accesses and interleaved accesses to memory.

3. The memory controller of claim 1, wherein the memory controller is coupled to the memory absent an address parity line or an address parity error line, such that protecting integrity of bits on the address bus is performed by the error code transmitted via the error code bus.

4. The memory controller of claim 1, wherein the error code indicates detection of a single error of the address.

5. The memory controller of claim 1, wherein the error code indicates correction of a single error of the data and detection of a double error of the data.

6. The memory controller of claim 1, wherein the error code protects both the address and the data between the memory and the memory controller.

7. The memory controller of claim 1, wherein the error code is 8 bits.

8. The memory controller of claim 1, wherein a user can select a mode of error code protection of the data among at least one of protecting the data, protecting the address, and protecting both the data and the address.

9. The memory controller of claim 1, wherein the error code generation module is further configured to generate the error code by an exclusive-or operation of selected bits of the data and selected bits of the address.

10. The memory controller of claim 1, wherein the address interface is further configured to write address information to a register of the memory, the register being configured to receive the address information and relay the address information to a corresponding portion of the memory.

11. The memory controller of claim 10, wherein the register includes at least one of an address parity line and an address parity error line.

12. The memory controller of claim 11, wherein the address parity line and the address parity error line are unused.

13. A method comprising:

writing data to a memory by a data interface coupled to the memory via a data bus;

providing an address to the memory by an address interface coupled to the memory via an address bus;

generating an error code based on a function of the data and the address, the error code being a combination of a check bit code and a gray code; and responsive to a write request for the data, storing the error code at a portion of the memory corresponding to the address.

14. The method of claim 13, further comprising performing both sequential accesses and interleaved accesses to the memory.

15. The method of claim 13, wherein the error code is configured to protect integrity of bits on the address bus.

16. The method of claim 13, wherein the error code indicates detection of a single error of the address.

17. The method of claim 13, wherein the error code indicates correction of a single error of the data and detection of a double error of the data.

18. The method of claim 13, wherein the error code protects both the address and the data between the memory and the memory controller.

19. The method of claim 13, wherein the error code is 8 bits.

20. The method of claim 13, wherein a user can select a mode of error code protection of the data among at least one of protecting the data, protecting the address, and protecting both the data and the address.

21. The method of claim 13, wherein the error code is generated by an exclusive-or operation of selected bits of the data and selected bits of the address.

22. The method of claim 13, wherein the memory includes a register, and further comprising:

at the register:

receiving address information; and relaying the address information to a corresponding portion of the memory.

* * * * *